(12) United States Patent
Janitch

(10) Patent No.: US 11,543,280 B2
(45) Date of Patent: Jan. 3, 2023

(54) GWR PROBE FOR INTERFACE MEASUREMENT AND VISCOUS FLUIDS

(71) Applicant: Magnetrol International, Incorporated, Aurora, IL (US)

(72) Inventor: Paul G. Janitch, Lisle, IL (US)

(73) Assignee: Ametek Magnetrol USA, LLC, Berwyn, PA (US)

( * ) Notice: Subject to any disclaimer, the term of this patent is extended or adjusted under 35 U.S.C. 154(b) by 801 days.

(21) Appl. No.: 16/507,672

(22) Filed: Jul. 10, 2019

(65) Prior Publication Data
US 2021/0010845 A1    Jan. 14, 2021

(51) Int. Cl.
| | |
|---|---|
| *G01R 31/00* | (2006.01) |
| *G01R 27/04* | (2006.01) |
| *G01N 22/00* | (2006.01) |
| *G01N 22/04* | (2006.01) |
| *G01F 23/284* | (2006.01) |
| *G01S 7/02* | (2006.01) |
| *G01R 1/07* | (2006.01) |
| *G05D 9/00* | (2006.01) |
| *G01R 27/02* | (2006.01) |
| *G01R 1/067* | (2006.01) |

(52) U.S. Cl.
CPC ............ *G01F 23/284* (2013.01); *G01R 1/07* (2013.01); *G01R 27/02* (2013.01); *G01S 7/027* (2021.05); *G05D 9/00* (2013.01); *G01R 1/067* (2013.01)

(58) Field of Classification Search
CPC ........ G01R 31/00; G01R 31/02; G01R 27/04; G01N 22/00; G01N 22/04
See application file for complete search history.

(56) References Cited

U.S. PATENT DOCUMENTS

| | | | | |
|---|---|---|---|---|
| 4,544,880 A | * | 10/1985 | Nagy ..................... | G01N 22/00 324/642 |
| 5,136,249 A | * | 8/1992 | White .................... | G01R 27/06 324/642 |
| 6,461,808 B1 | * | 10/2002 | Bodner .................. | G01N 22/00 435/7.1 |
| 9,069,056 B2 | | 6/2015 | Janitch | |
| 9,217,659 B2 | | 12/2015 | Janitch | |
| 9,360,361 B2 | | 6/2016 | Flasza et al. | |
| 2004/0066588 A1 | * | 4/2004 | Flasza ..................... | H01Q 1/38 361/9 |
| 2014/0104099 A1 | * | 4/2014 | Janitch ................... | G01S 13/10 342/124 |

* cited by examiner

*Primary Examiner* — Neel D Shah
(74) *Attorney, Agent, or Firm* — Wood, Phillips, Katz, Clark & Mortimer

(57) ABSTRACT

There is disclosed a probe used with a measurement instrument including a pulse circuit for generating pulses. A coaxial connector is secured to the probe case so that the probe case is electrically connected to the ground shield. A center rod has a top end received in the probe case and to extend into a process liquid. The center rod is electrically connected to the center terminal for conducting the pulses. Ground rods are spaced around the center rod and are secured to the probe case. The probe provides an open configuration less susceptible to build-up between the center rod and the ground rods. One or more of the ground rods may by tubes, connected to a flushing port, with nozzles for cleaning the enter rod. Another ground rod may be tubular for carrying a conductor connected to a bottom of the center rod for bottom-up measurement.

20 Claims, 6 Drawing Sheets

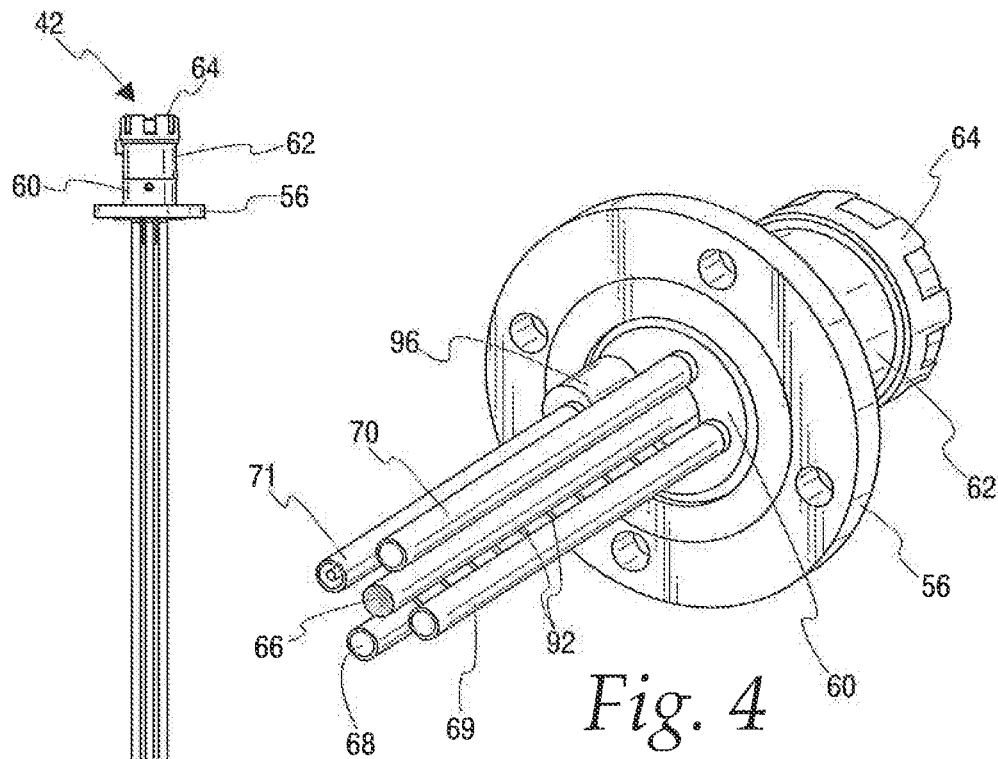
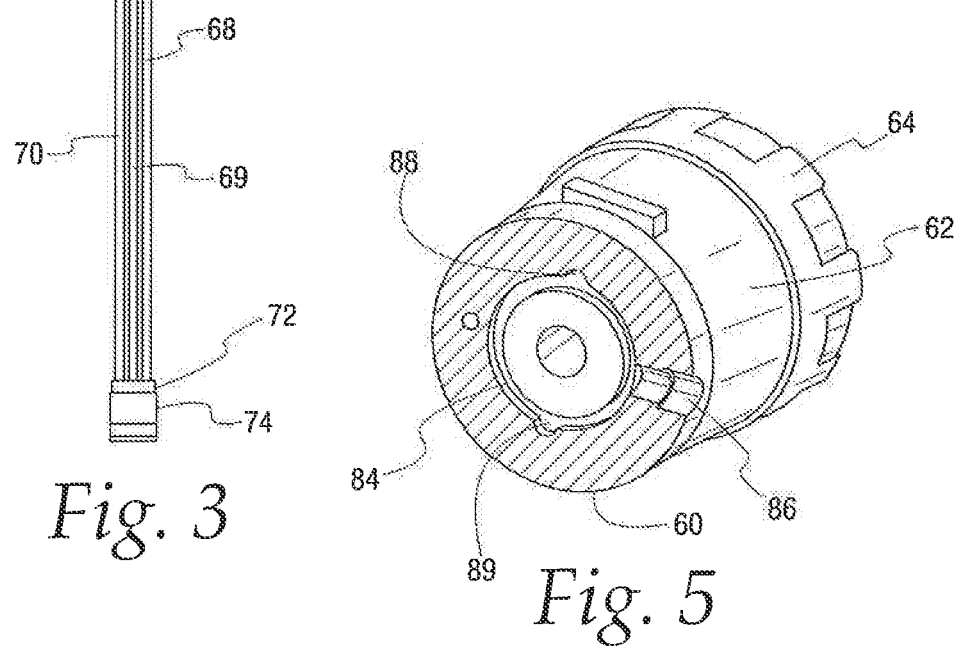
Fig. 3
Fig. 4
Fig. 5

GWR PROBE FOR INTERFACE MEASUREMENT AND VISCOUS FLUIDS

CROSS-REFERENCE TO RELATED APPLICATIONS

There are no related applications.

FEDERALLY SPONSORED RESEARCH OR DEVELOPMENT

Not Applicable.

MICROFICHE/COPYRIGHT REFERENCE

Not Applicable.

FIELD OF THE INVENTION

This invention relates to process control instruments, and more particularly, to a guided wave radar probe for use in interface measurement applications and for viscous fluids.

BACKGROUND

Process control systems require the accurate measurement of process variables. Typically, a primary element senses the value of a process variable and a transmitter develops an output having a value that varies as a function of the process variable. For example, a level transmitter includes a primary element for sensing level and a circuit for developing an electrical signal proportional to sensed level.

Knowledge of level in industrial process tanks or vessels has long been required for safe and cost-effective operation of plants. Many technologies exist for making level measurements. These include buoyancy, capacitance, ultrasonic and microwave radar, to name a few. Recent advances in micropower impulse radar (MIR), also known as ultra-wideband (UWB) radar, in conjunction with advances in equivalent time sampling (ETS), permit development of low power and low cost time domain reflectometry (TDR) instruments.

In a TDR instrument, a very fast pulse with a rise time of 500 picoseconds, or less, is propagated down a probe that serves as a transmission line in a vessel. The pulse is reflected by a discontinuity caused by a transition between two media. For level measurement, that transition is typically where the air and the material to be measured meet. These instruments are also known as guided wave radar (GWR) measurement instruments.

One type of probe used by GWR level instruments is a coaxial probe. The coaxial probe consists of an outer tube and an inner conductor. When a coaxial probe is immersed in the liquid to be measured, there is a section of constant impedance, generally air, above the liquid surface. An impedance discontinuity is created at the level surface due to the change in dielectric constant of the liquid versus air at this point. When the GWR signal encounters any impedance discontinuity in the transmission line part of the signal is reflected back toward the source in accordance with theory based on Maxwell's laws. The GWR instrument measures the time of flight of the electrical signal to, and back from, this reflecting point, being the liquid surface, to find the liquid level.

GWR probes are frequently used in tanks where multiple layers of fluids can exist, or in applications with highly viscous liquid. One example of such an application is in the oil and gas industry. Well fluid containing crude oil, water, sand and other impurities enters a separator tank as a mixture. This is generally illustrated in FIG. 1. The fluids stratify by way of density variations of gases on top, oil in the middle and water on the bottom. Solids will descend to the bottom of the tank or be suspended at an interface between adjacent layers. An emulsion layer made up of a mixture of water and oil occurs between the layers as the stratification process stabilizes. After a period of time, the components can be separated using weirs or other means.

The objective of the GWR probe in such applications is to accurately measure several levels, including, the top of the oil layer, the bottom of the oil layer (i.e., the top of the emulsion layer) and the top of the water layer (i.e., the bottom of the emulsion layer). There are several difficulties when using GWR measurement instruments in interface applications or with viscous fluids. GWR is commonly used to measure fluid interface levels where the dissimilar dielectric properties of adjacent layers produce a reflection from the transmitted signal at the boundary. However, interface detection becomes more difficult when a thick emulsion layer is present and the dielectric properties of the fluid changes gradually. It has been observed that a small percentage of water in oil creates a significant difference in the dielectric properties compared to oil alone. A small percentage of oil in water behaves much like water alone. Therefore, it is more difficult to discern the interface between water and an emulsion of water with a small percentage of oil compared to the interface between oil and an emulsion of oil with a small percentage of water. As such, it is more difficult to detect the bottom of the emulsion layer than the top of the emulsion layer.

Also, some components of crude oil may be highly viscous or sticky and can cause build-up in a coaxial GWR probe. Excessive build-up in the probe can cause errors in the measurement, or possibly prevent the probe from working at all. Additionally, transmitted energy is absorbed in the oil and emulsion layers. This makes detection of the bottom of the emulsion more difficult.

The present invention is directed to solving one or more of the problems discussed above in a novel and simple manner.

SUMMARY

As described herein, a probe is adapted for use in interface measurement and for use with viscous fluids.

In accordance with one aspect, a probe defines a transmission line for use with a measurement instrument including a pulse circuit connected to the probe for generating pulses on the transmission line and receiving reflected pulses on the transmission line. The probe comprises a process connection for mounting to a process vessel. A cylindrical probe case extends above the process connection. A coaxial connector has a center terminal and a ground shield for connection to the pulse circuit. The coaxial connector is secured to the probe case so that the probe case is electrically connected to the ground shield. An elongate center rod has a top end coaxially received in the probe case and extending downward from the process connection to extend into a process liquid. The center rod is electrically connected to the center terminal for conducting the pulses. At least three elongate ground rods are equally angularly spaced around the center rod and are secured to the probe case to extend into the process liquid. The probe provides an open configuration less susceptible to build-up between the center rod and the ground rods.

It is a feature that the center rod comprises a metal rod with a fluorocarbon outer sleeve.

It is another feature that the ground rods comprise metal tubes. The probe case may comprise a flushing port in communication with one or more channels in the probe case and one or more of the ground rods open into the one or more of the channels. The one or more of the ground rods comprise a plurality of spray nozzles directed at the center rod.

It is another feature that one of the ground rods comprises a tube and further comprising an electrical cable having a coaxial connector in the probe case at an upper end for connection to the probe circuit and the cable passes through the tube and is connected to a bottom end of the center rod for bottom-up measurement.

It is a further feature that a cylindrical bottom case receives the bottom of the center rod. A pin assembly has a pin connected to the center rod and a bushing received in the bottom case for connection to a coaxial connector at a bottom end of the cable.

It is another feature to provide four elongate ground rods equally angularly spaced around the center rod and secured to the probe case to extend into the process liquid.

In accordance with another aspect, there is described a probe comprising a process connection for mounting to a process vessel. A cylindrical probe case extends above the process connection. A connector is secured to the probe case for connection to the pulse circuit. An elongate center rod has a top end coaxially received in the probe case and extending downward from the process connection to extend into a process liquid. The center rod is electrically connected to the connector for conducting the pulses. A plurality of elongate tubular ground rods are equally angularly spaced around the center rod and secured to the probe case to extend into the process liquid. The probe case comprises a flushing port in communication with one or more channels in the probe case and one or more of the tubular ground rods open into the one or more channels. The one or more of the tubular ground rods comprise a plurality of spray nozzles directed at the center rod.

It is a feature that the probe case has a through opening which widens at a top end of the case to define a shoulder and an annular channel surrounds the through opening above the shoulder. The flushing port is in a side of the case and opens into the annular channel and the one or more vertical channels in the probe case are in communication with the annular channel. The one or more tubular ground rods are aligned with the one or more vertical channels.

It is another feature that a gland bushing is received in the probe case upper end and rests on the shoulder to capture the center rod in the probe case.

In accordance with a further aspect, there is disclosed a probe having a process connection for mounting to a process vessel. A cylindrical probe case extends above the process connection. A connector is secured to the probe case for connection to the pulse circuit. An elongate center rod has a top end coaxially received in the probe case and extending downward from the process connection to extend into a process liquid. The center rod is electrically connected to the connector for conducting the pulses. A plurality of elongate ground rods are spaced around the center rod and secured to the probe case to extend into the process liquid. One of the ground rods is tubular and receives an electrical cable having a coaxial connector in the probe case at an upper end for connection to the probe circuit and the cable passes through the tubular ground rod and is connected to a bottom end of the center rod for bottom-up measurement.

Other features and advantages will be apparent from a review of the entire specification, including the appended claims and drawings.

BRIEF DESCRIPTION OF THE DRAWINGS

FIG. 3 is a side elevation view of the GWR probe;

FIG. 4 is a cut away perspective view of the top of the GWR probe;

FIG. 5 is a sectional view taken along the line 5-5 of FIG. 6;

DETAILED DESCRIPTION

Figure 1:
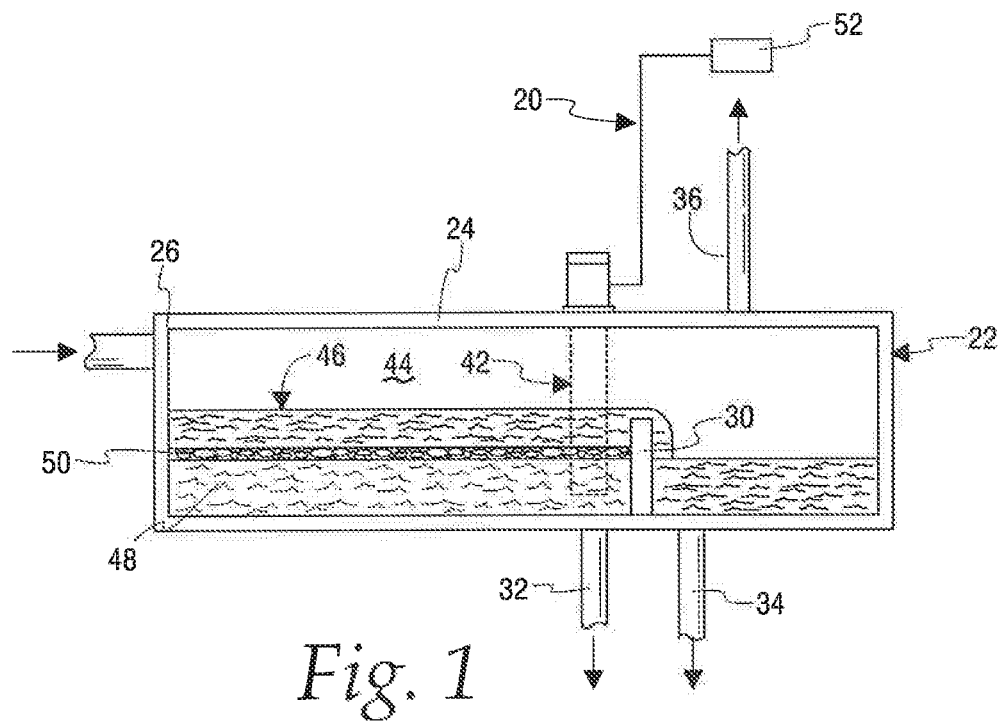
FIG. 1 is a sectional view of a process vessel including a guided wave radar (GWR) measurement instrument with a probe for measuring level in tanks with multiple layers of fluids and/or highly viscous liquids.

Referring initially to FIG. 1, a process instrument 20 in the form of a guided wave radar (GWR) level measurement instrument is illustrated used on a process vessel 22. The process vessel 22 is by way of example and in the illustrated embodiment comprises a separator tank 24 having an inlet 26 for receiving well fluid in-flow. The tank 24 includes a weir 30 extending upwardly from a bottom of the tank 24. A water outlet 32 is on the bottom of the tank 24 on the inlet side of the weir 30. An oil outlet 34 is on the opposite side of the weir 30. A gas outlet 36 is provided on the top of the tank 24. The process instrument 20 comprises a probe 42 extending into an interior 44 of the tank 24.

The control circuitry of the process instrument 20 may take many different forms. This application is particularly directed to the probe 42, as described below. It should be noted in FIG. 1 and FIG. 2 the portion of the probe 42 extending into the tank 24 is illustrated in dashed lines as detail is provided in other figures.

As described previously, well fluid provided at the inlet 26 may contain crude oil, water, sand and other impurities. The fluids stratify to produce an oil layer 46 and water layer 48 separated by an emulsion 50. The water is to the left of the weir 30 in the orientation shown in FIG. 1 and can be selectively removed using the water outlet 32. Oil in the oil layer 46 at a level higher than the weir 30 can drop to the right of the weir 30 and be selectively removed using the oil outlet 34 as is conventional. The process instrument 20 is particularly adapted to measure the top of the oil layer 46, the bottom of the oil layer 46, and the top of the water layer 48.

The probe 42 is adapted to address obstacles mentioned above. A traditional coaxial probe has a tendency to entrap product build-up when used in viscous fluids. As described herein, the conventional outer tube of a coaxial probe is replaced by ground rods to create an open configuration which is less susceptible to build-up between the center rod and around the ground rods.

The process instrument 20 uses pulsed radar in conjunction with equivalent time sampling (ETS) and ultra-wide band (UWB) transceivers for measuring level using time domain reflectometry (TDR). Particularly, the instrument 20 uses guided wave radar for sensing level. While the embodiment described herein relates to a guided wave radar level sensing apparatus, various aspects of the invention may be used with other types of process instruments for measuring various process parameters.

The probe 42 is able to transmit and receive signals from both ends when used in connection with a signal circuit having two TDRs. A "top-down" circuit sends a signal down the probe 42 from the top and detects signals that are reflected back to the top. A "bottom-up" circuit sends a signal up the probe 42 from the bottom and detects signals that are reflected back to the bottom. The ability to transmit from the bottom-up has the advantage of improved detection of the emulsion layer bottom. Such a system is described in Applicant's application Ser. No. 16/278,368, filed Feb. 18, 2019, the specification of which is incorporated by reference herein. The transmission cable for the bottom-up transmission line runs through one of the ground rods, which is tubular, as described below.

The probe 42 has a center rod which may be of stainless steel or other metal, Nickel alloys, such as Hastelloy or Inconel, may be used for corrosion resistance. The rod has PFA sleeve. Other fluorocarbon materials, such as PTFE, or other electrical insulating coatings may be used. The purpose is to allow maximum signal penetration through the process as described in Applicant's U.S. Pat. No. 9,360,361.

As described below, the ground rods may be tubular. In the illustrated embodiment, two of the ground rods have a series of machined holes to create cleaning nozzles. These tubes are on opposite sides of the center rod with the cleaning nozzles facing toward the center rod. Pressurized cleaning fluid enters a flushing port in the probe top, flows through internal channels in the probe case and into the flushing tube ground rods. The fluid exits the ground rods through nozzles where it sprays and cleans the center rod.

Figure 2:
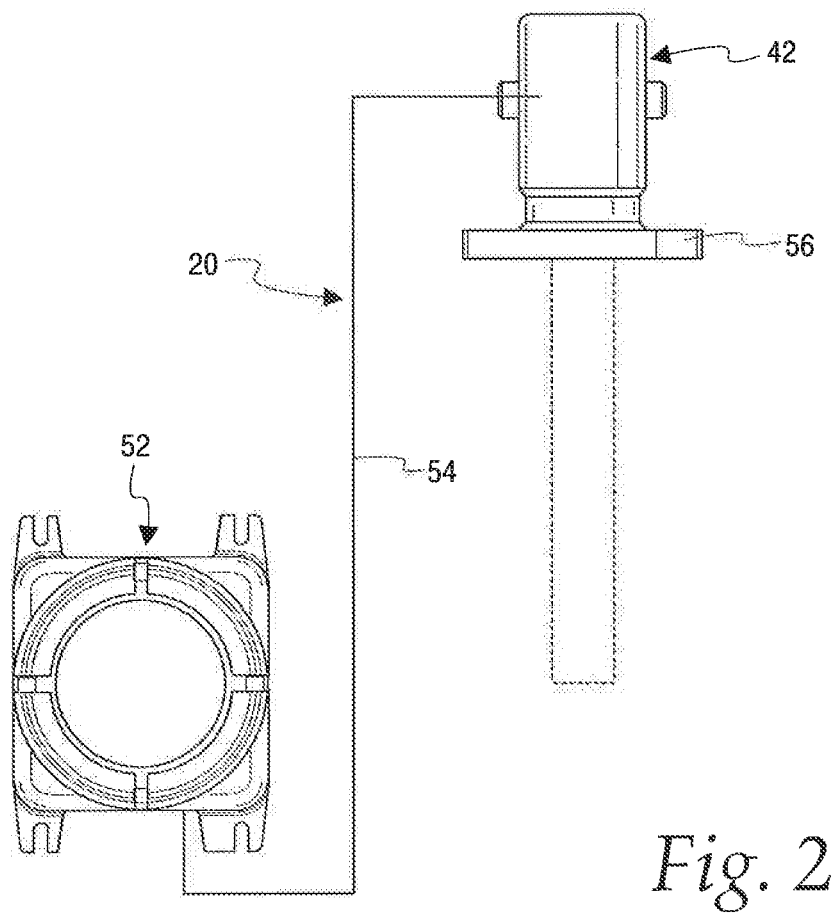
FIG. 2 is a generalized view of the GWR measurement instrument used in FIG. 1.
Figure 6:
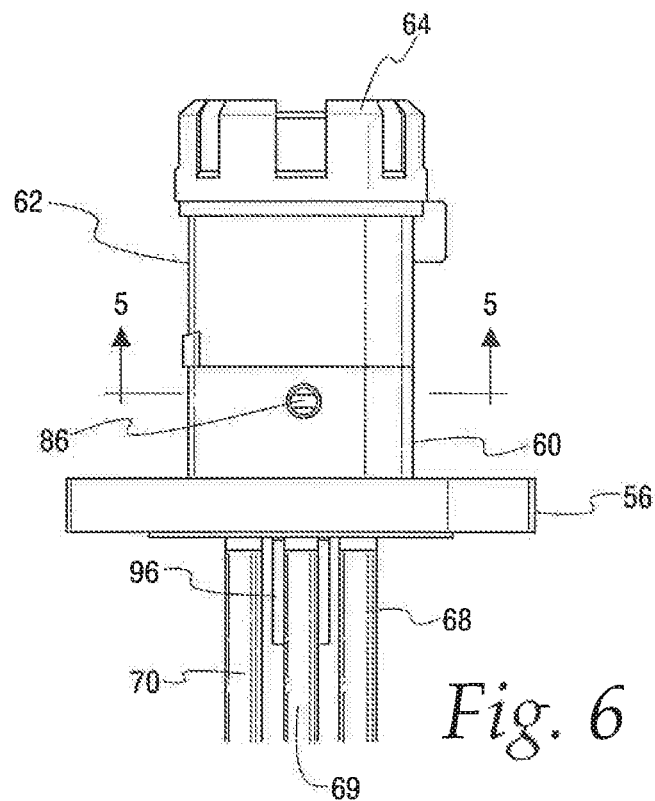
FIG. 6 is a side elevation cut-away view of the of the GWR probe.

Referring to FIG. 2, the process instrument 20 includes a control housing 52, the probe 42, and a cable 54 for connecting the probe 42 to the housing 52. The probe 42 is mounted to the process vessel 22 using a process connection, such as a flange 56. Alternatively, a process adaptor could be used. The housing 52 is remote from the probe 42. The probe 42 comprises a high frequency transmission line which, when placed in a fluid, can be used to measure level of the fluid. Particularly, the probe 42 is controlled by a controller, not shown, in the housing 52 for determining level in the vessel. The controller may take many known forms. The invention herein is not limited to any particular controller.

As is known, the controller causes the probe 42 to generate and transmits pulses. A reflected signal is developed off any impedance changes, such as the liquid surface of the material being measured. A small amount of energy may continue down the probe 42.

Guided wave radar combines TDR, ETS and low power circuitry. TDR uses pulses of electromagnetic (EM) energy to measure distance or levels. When a pulse reaches a dielectric discontinuity then a part of the energy is reflected. The greater the dielectric difference, the greater the amplitude of the reflection. In the measurement instrument 20, the probe 42 comprises a wave guide with a characteristic impedance in air. When part of the probe 42 is immersed in a material other than air, there is lower impedance due to the increase in the dielectric. When the EM pulse is sent down the probe it meets the dielectric discontinuity, a reflection is generated.

ETS is used to measure the high speed, low power EM energy. The high speed EM energy (1000 foot/microsecond) is difficult to measure over short distances and at the resolution required in the process industry. ETS captures the EM signals in real time (nanoseconds) and reconstructs them in equivalent time (milliseconds), which is much easier to measure. ETS is accomplished by scanning the wave guide to collect thousands of samples. Approximately eight scans are taken per second.

Figure 7:
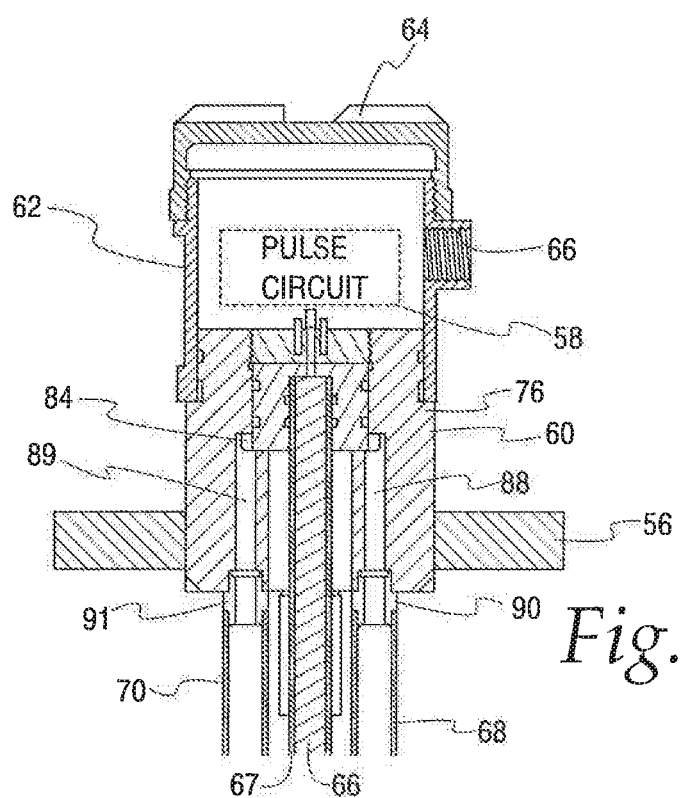
FIG. 7 is a side elevation, similar to FIG. 6, shown in section.

The probe 42 uses a pulse circuit 58, illustrated in block diagram form in FIG. 7, controlled by the controller in the control housing 52, for generating pulses on the transmission line and receiving reflected pulses on the transmission line representing levels of interest.

The general concept implemented by the ETS circuit is known. The pulse circuit 58 generates hundreds of thousands of very fast pulses of 500 picoseconds or less rise time every second. The timing between pulses is tightly controlled. The reflected pulses are sampled at controlled intervals. The samples build a time multiplied "picture" of the reflected pulses. Since these pulses travel on the probe 42 at the speed of light, this picture represents approximately ten nanoseconds in real time for a five-foot probe. The pulse circuit 58 converts the time to about seventy-one milliseconds. As is apparent, the exact time would depend on various factors, such as, for example, probe length. The largest signals have an amplitude on the order of twenty millivolts before amplification to the desired amplitude by common audio amplifiers. The controller converts timed interrupts into distance. With a given probe length the controller can calculate the level by subtracting from the probe length the difference between the fiducial and level distances. Changes in measured location of the reference target can be used for velocity compensation, as necessary or desired.

Referring to FIGS. 3-7, the probe 42 comprises a probe case 60 connected to the flange 56 such as by welding. A top housing 62 is connected to the probe case 60 and houses the pulse circuit 58 and is closed by a top cover 64. The top housing 62 includes a threaded side opening 66 for receiving the cable 54, see FIG. 2. Secured to and extending downwardly from the probe case 60 are a center rod 66, defining the transmission line, surrounded by four equally, angularly spaced ground rods 68, 69, 70 and 71. The length of the center rod 66 and ground rods 68-71 are dependent on the height of the vessel 22 and the level to be measured. The center rod 66 is a metal rod with a PFA outer sleeve 67. Other materials may be used, as discussed above. A bottom case 72 is connected at a bottom end of the around rods 68-71 and is connected to a bottom enclosure 74.

Figures 11, 12:
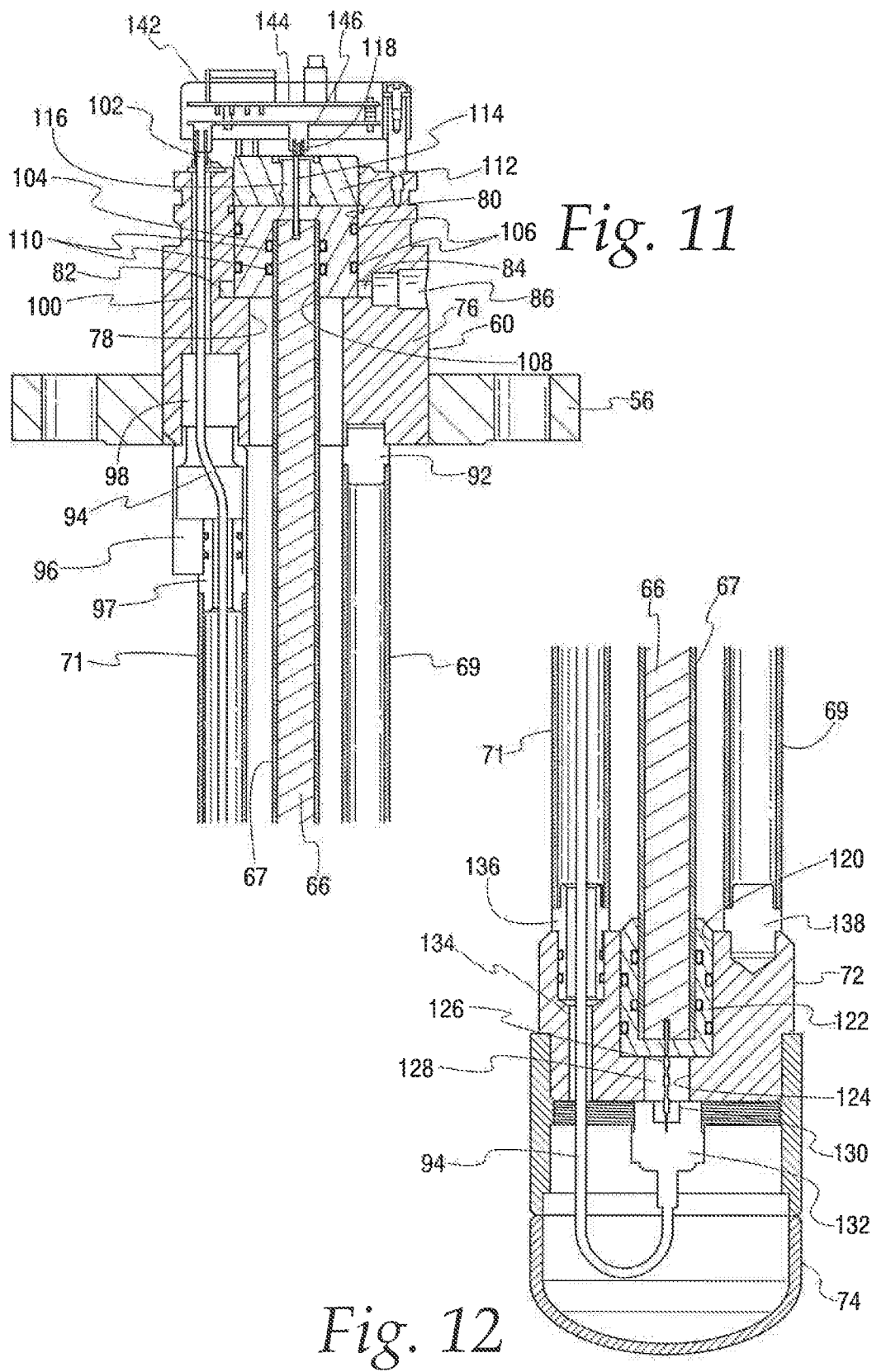
FIG. 11 is a section view of the probe top of FIG. 10.
FIG. 12 is a sectional view of the probe bottom.

Referring also to FIG. 11, the probe case 60 comprises a stainless-steel cylindrical body 76 having a through opening 78 enlarged at a top end 80 to define an upward facing shoulder 82. An annular channel 84 surrounds the through opening upper end 80 at the shoulder 82, see also FIG. 5. A flushing port 86 in the cylindrical body 76 is radially directed and in communication with the annular channel 84. A pair of vertical channels 88 and 89, see FIG. 7, extend downwardly from the annular channel 84 and opening at the bottom of the cylindrical body 76, as shown in FIG. 7. Cylindrical adaptors 90 and 91 are welded to the probe case body 76 aligned with the respective vertical channels 88 and 89 and are likewise welded to the top of the ground rods 68 and 70. In the illustrated embodiment, the ground rods 68 and 70 are stainless-steel tubes, although other metals may be used. As such, the flushing port 86 via the annular channel 84 and vertical channels 88 and 89 are open to the ground rods 68 and 70. The ground rods 68 and 70 include a plurality of vertically spaced nozzle openings 92, which are seen in FIG. 4 for the ground rod 68. The nozzle openings 92 are directed at the center rod 66.

Figure 8:
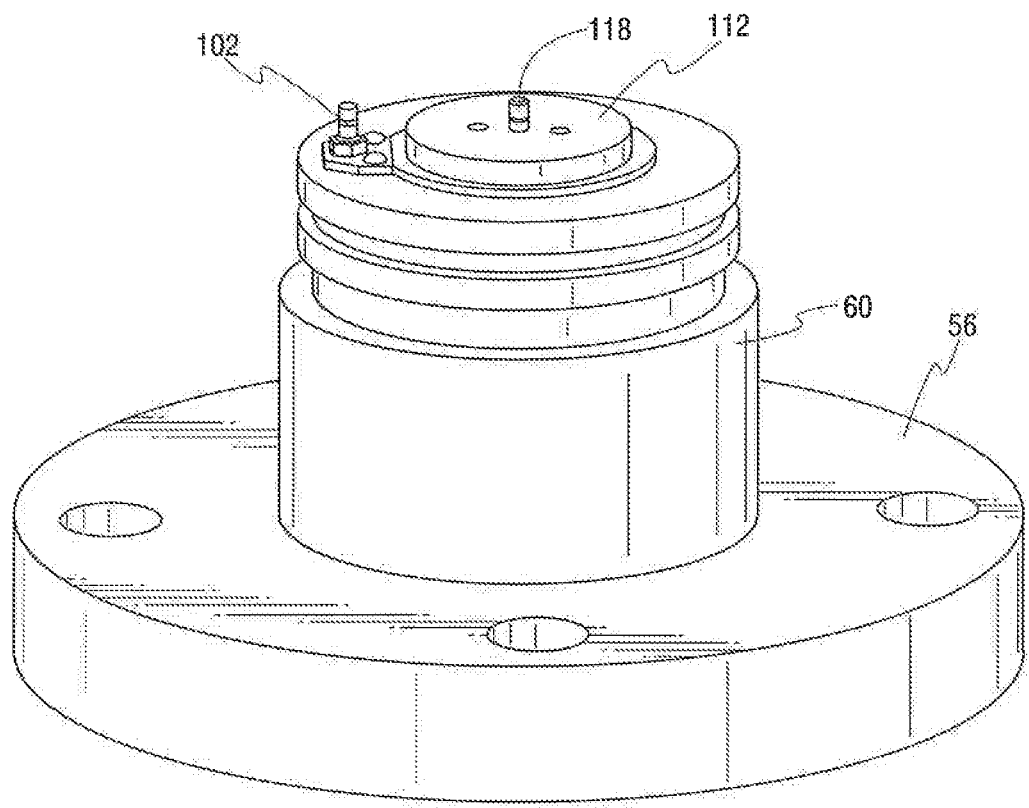
FIG. 8 is a perspective view of a probe top assembly.

Referring again to FIG. 11, the second ground rod 69 is a metal tube, such as stainless-steel or the like, connected via an adaptor 92 to the probe cylindrical body 76. The fourth ground rod 71, which is also a metal tube, such as stainless-steel or the like, is adapted for carrying a coaxial cable 94 used for bottom-up measurement. The ground rod 71 is secured as by welding to a cylindrical connector 96 connected to an enlarged cylindrical adaptor 96 connected to the probe cylindrical body 76 in alignment with a blind bore 98 in communication with a through opening 100. The adapter 96 is used to offset the cable 94 to bypass the seal structure, discussed below. A sub-miniature version B (SMB) coaxial connector 102, see also FIG. 8, is connected to the top of the probe body 76 at the through opening 100 for connection to the cable 94.

A PTFE gland bushing 104 is received in the probe case opening top end 80 and rests on the shoulder 82. The gland bushing 104 includes outer O-rings 106 for sealing with the probe case body 76. The gland bushing 104 includes a downwardly opening blind bore 108 receiving the center rod 66 and is provided with O-ring seals 110. A stainless-steel annular bushing 112 is threadably received in the opening top end 80 to sandwich the gland bushing 104 against the shoulder 82. The annular bushing 112 receives a pin 114 encapsulated in epoxy 116. The pin 114 is electrically connected to the center rod 66 and at an opposite end to an SMB connector 118, see also FIG. 8.

Referring to FIG. 12, the bottom case 72 is cylindrical and of stainless-steel and has an upwardly opening blind bore 120 receiving a PTFE gland bushing 122 which captures a bottom end of the center rod 66. A through opening 124 aligned with the blind bore 120 receives a pin 126 surround by epoxy 128. The pin 126 is connected at one end to the center rod 66 and at the opposite end to an SMB connector 130 for connection to a coax connector 132 connected to a bottom end of the cable 94. The cable 94 passes through a vertical opening 134 in the bottom probe case 72 which receives a cylindrical adapter 136 for connecting the fourth ground rod 71 to the probe bottom case 72. A solid adaptor 138, similar to the adaptor 92 of FIG. 11, is used for securing the second ground rod 69 to the bottom case 72 such as by welds. Similar connectors (not shown) are used for the ground rods 68 and 70. These weld connections for the ground rods 68-71 directly connect the bottom case 72 to the probe case 60. As a result, the center rod 66 is captured between the two PTFE gland bushings 104 and 122 at each end and sealed with O-rings.

Figure 9:
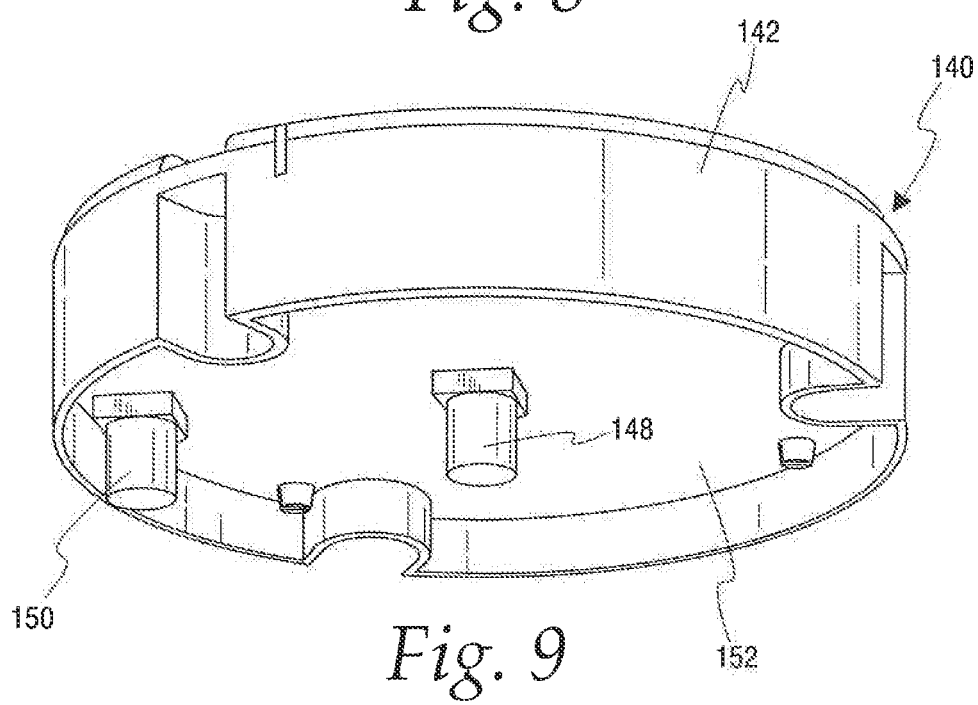
FIG. 9 is a bottom perspective view of a potted circuit module.
Figure 10:
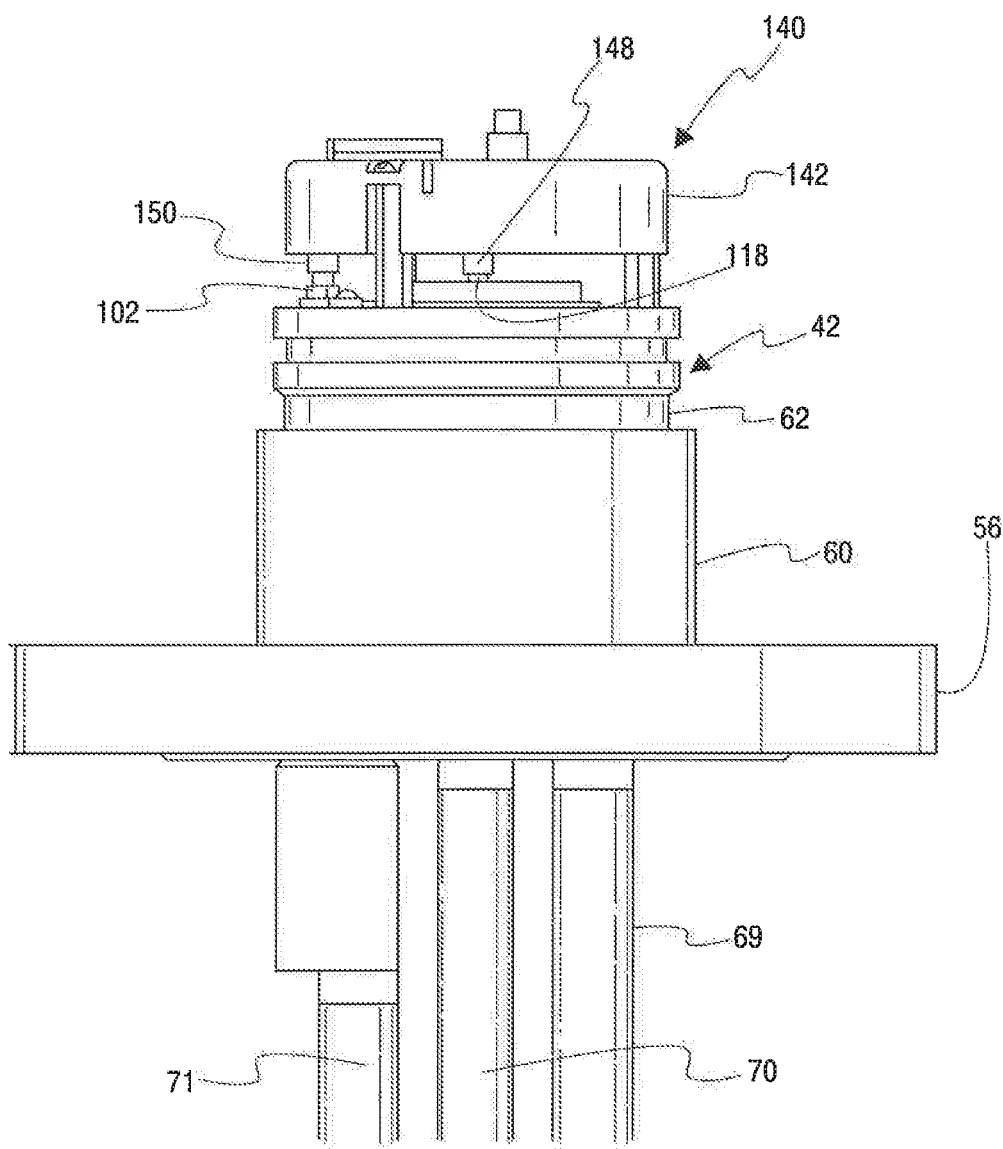
FIG. 10 is a side elevation view of the probe top showing the potted module assembled on the probe top.

Referring to FIG. 9, a potted module 140 is illustrated. The potted module 140 includes a plastic housing 142 enclosing circuit boards 144 and 146, see FIG. 11, including the pulse circuit illustrated in block form 58 in FIG. 7. A pair of coax connectors 148 and 150 extend downwardly from the lower circuit board 146 with the entire structure being covered by a potting compound 152 to seal the circuitry. As shown in FIG. 10, the potted module 140 is mounted atop the probe case 60 with the connector 118 mated with the connector 148 and the connector 102 mated with the connector 150 to provide electrical connections between the pulse circuit 58 and the center rod 66 at both the top end and the bottom end.

While the probe 42 is illustrated with four ground rods 68-71, the probe could use three ground rods. With three ground rods, the probe will be referred to as a four-wire probe, while with four ground rods, the probe is referred to as a five-wire probe.

Thus, in accordance with the invention, the probe 42 has three or more ground rods instead of the traditional coaxial tube. This open configuration reduces build up on the probe while maintaining performance similar to that of a coaxial probe configuration. The ground rods can be tubes with spray nozzles used to rinse off build up with cleaning fluids connected via the flushing port 86. Also, one of the ground rods can be used to run an electrical cable to the bottom of the center rod 66 for bottom-up measurement which is used for emulsion detection.

In the illustrated embodiment, there are two TDR circuits on the circuit board 144 in the potted module 140. One is for the top down signal and the other is for the bottom-up signal. The waveforms are sent from the TDR board 144 to the controller in the control housing 52, see FIGS. 1 and 2. The level calculations, outputs and user interface are with the controller. The circuitry may be as necessary or desired, including that in co-pending application Ser. No. 16/278,368, incorporated by reference.

As described, the ground shield of the SMB connectors 102 and 118 tie to the probe case 60 and thus with the ground rods 68-71 and the bottom case 72. The center conductor of the SMB connecter 118, for the top down circuit, connects to the pin 114 that passes through the epoxy 116 and then through the PTFE gland bushing 104, which provides a seal, where it connects to the center rod 66. The top of the probe is a coaxial transmission line from the SMB connector 118 to the flange face 56 where it transitions to a five-wire probe. The similar structure at the bottom transitions from a coax to a five-wire structure as illustrated in FIG. 12.

In the illustrated embodiment, the center rod 66 is trapped between the top gland bushing 104 and the bottom gland busing 122 and sealed with O-rings. The pin assemblies at the top and bottom provide appropriate connections to the pulse circuit 58.

Thus, as described herein, the guided wave radar probe is used for measuring levels in tanks where multiple layers of fluids can exist, and in applications with highly viscous liquids.

It will be appreciated by those skilled in the art that there are many possible modifications to be made to the specific forms of the features and components of the disclosed embodiments while keeping within the spirit of the concepts disclosed herein. Accordingly, no limitations to the specific forms of the embodiments disclosed herein should be read into the claims unless expressly recited in the claims. Although a few embodiments have been described in detail above, other modifications are possible. Other embodiments may be within the scope of the following claims.

The invention claimed is:

1. A probe defining a transmission line for use with a level measurement instrument including a pulse circuit connected to the probe for generating pulses on the transmission line and receiving reflected pulses on the transmission line representing levels of interest, the probe comprising:
   a process connection for mounting to a process vessel;
   a cylindrical probe case extending above the process connection;
   a coaxial connector having a center terminal and a ground shield for connection to the pulse circuit, the coaxial connector being secured to the probe case so that the probe case is electrically connected to the ground shield;

an elongate center rod having a top end coaxially received in the probe case and extending downward from the process connection to extend into a process liquid, the center rod being electrically connected to the center terminal for conducting the pulses; and at least three elongate ground rods equally angularly spaced around the center rod and secured to the probe case to extend into the process liquid, wherein the probe provides an open configuration less susceptible to build up between the center rod and ground rods.

2. The probe of claim 1 wherein the center rod comprises a metal rod with a fluorocarbon sleeve surrounding the metal rod.

3. The probe of claim 1 wherein the ground rods comprise metal tubes.

4. The probe of claim 3 wherein the probe case comprises a flushing port in communication with one or more channels in the probe case and one or more of the ground rods open into the one or more channels, the one or more of the ground rods comprising a plurality of spray nozzles directed at the center rod.

5. The probe of claim 1 wherein one of the ground rods comprises a tube and further comprising an electrical cable having a coaxial connector in the probe case at an upper end for connection to the probe circuit and the cable passes through the tube and is connected to a bottom end of the center rod for bottom-up measurement.

6. The probe of claim 5 further comprising a cylindrical bottom case receiving the bottom end of the center rod, and a pin assembly having a pin connected to the center rod and a bushing received in the bottom case for connection to a coaxial connector at a bottom end of the cable.

7. The probe of claim 1 comprising four elongate ground rods equally angularly spaced around the center rod and secured to the probe case to extend into the process liquid.

8. A probe defining a transmission line for use with a level measurement instrument including a pulse circuit connected to the probe for generating pulses on the transmission line and receiving reflected pulses on the transmission line representing levels of interest, the probe comprising:

a process connection for mounting to a process vessel;

a cylindrical probe case extending above the process connection;

a connector secured to the probe case for connection to the pulse circuit;

an elongate center rod having a top end coaxially received in the probe case and extending downward from the process connection to extend into a process liquid, the center rod being electrically connected to the connector for conducting the pulses; and a plurality of elongate tubular ground rods spaced around the center rod and secured to the probe case to extend into the process liquid, wherein the probe case comprises a flushing port in communication with one or more channels in the probe case and one or more of the tubular ground rods open into the one or more channels, the one or more of the tubular ground rods comprising a plurality of spray nozzles directed at the center rod.

9. The probe of claim 8 wherein the probe case has a through opening which widens at a top end of the case to define a shoulder and an annular channel surrounds the through opening above the shoulder and wherein the flushing port is in a side of the case and opens into the annular channel and one or more vertical channels in the probe case are in communication with the annular channel and the one or more of the tubular ground rods are aligned with the one or more vertical channels.

10. The probe of claim 9 further comprising a gland bushing received in the probe case upper end and resting on the shoulder to capture the center rod in the probe case.

11. The probe of claim 8 wherein one of the tubular ground rods receiving an electrical cable having a coaxial connector in the probe case at an upper end for connection to the probe circuit and the cable passes through the one of the tubular ground rods and is connected to a bottom end of the center rod for bottom-up measurement.

12. The probe of claim 11 further comprising a cylindrical bottom case receiving the bottom end of the center rod, and a pin assembly having a pin connected to the center rod and a bushing received in the bottom case for connection to a coaxial connector at a bottom end of the cable.

13. The probe of claim 8 wherein the center rod comprises a metal rod with a fluorocarbon sleeve surrounding the metal rod.

14. The probe of claim 8 comprising four elongate tubular ground rods equally angularly spaced around the center rod and secured to the probe case to extend into the process liquid.

15. A probe defining a transmission line for use with a level measurement instrument including a pulse circuit connected to the probe for generating pulses on the transmission line and receiving reflected pulses on the transmission line representing levels of interest, the probe comprising:

a process connection for mounting to a process vessel;

a cylindrical probe case extending above the process connection;

a connector secured to the probe case for connection to the pulse circuit;

an elongate center rod having a top end coaxially received in the probe case and extending downward from the process connection to extend into a process liquid, the center rod being electrically connected to the connector for conducting the pulses; and a plurality of elongate ground rods spaced around the center rod and secured to the probe case to extend into the process liquid, wherein one of the ground rods is tubular and receives an electrical cable having a coaxial connector in the probe case at an upper end for connection to the probe circuit and the cable passes through the tubular ground rod and is connected to a bottom end of the center rod for bottom-up measurement.

16. The probe of claim 15 further comprising a cylindrical bottom case receiving the bottom end of the center rod, and a pin assembly having a pin connected to the center rod and a bushing received in the bottom case for connection to a coaxial connector at a bottom end of the cable.

17. The probe of claim 15 wherein the center rod comprises a metal rod with a fluorocarbon sleeve surrounding the center rod.

18. The probe of claim 15 wherein the ground rods comprise metal tubes.

19. The probe of claim 18 wherein the probe case comprises a flushing port in communication with one or more channels in the probe case and one or more of the tubular ground rods open into the one or more channels, the one or more of the tubular ground rods comprising a plurality of spray nozzles directed at the center rod.

20. The probe of claim 15 comprising four elongate ground rods equally angularly spaced around the center rod and secured to the probe case to extend into the process liquid.

\* \* \* \* \*